(12) United States Patent
Teramoto et al.

(10) Patent No.: US 10,249,486 B2
(45) Date of Patent: Apr. 2, 2019

(54) METHOD FOR POLISHING SEMICONDUCTOR SUBSTRATE

(71) Applicant: NITTA HAAS INCORPORATED, Osaka (JP)

(72) Inventors: Masashi Teramoto, Kyoto (JP); Tatsuya Nakauchi, Kyoto (JP); Noriaki Sugita, Kyoto (JP); Shinichi Haba, Kyoto (JP); Akiko Miyamoto, Kyoto (JP)

(73) Assignee: NITTA HAAS INCORPORATED, Osaka (JP)

( * ) Notice: Subject to any disclaimer, the term of this patent is extended or adjusted under 35 U.S.C. 154(b) by 0 days.

(21) Appl. No.: 15/129,842

(22) PCT Filed: Mar. 30, 2015

(86) PCT No.: PCT/JP2015/059925
§ 371 (c)(1),
(2) Date: Sep. 28, 2016

(87) PCT Pub. No.: WO2015/152152
PCT Pub. Date: Oct. 8, 2015

(65) Prior Publication Data
US 2017/0178888 A1 Jun. 22, 2017

(30) Foreign Application Priority Data

Mar. 31, 2014 (JP) ................................ 2014-073797

(51) Int. Cl.
*H01L 21/02* (2006.01)
(52) U.S. Cl.
CPC .. *H01L 21/02008* (2013.01); *H01L 21/02024* (2013.01)
(58) Field of Classification Search
None
See application file for complete search history.

(56) References Cited

U.S. PATENT DOCUMENTS

| | | | | |
|---|---|---|---|---|
| 5,868,604 | A * | 2/1999 | Atsugi | C09K 3/1463 106/1.05 |
| 6,383,404 | B1 * | 5/2002 | Sakai | B82Y 15/00 216/97 |
| 7,712,333 | B2 * | 5/2010 | Uno | B82Y 10/00 427/140 |
| 9,259,818 | B2 * | 2/2016 | Singh | H01L 21/30625 |
| 9,746,762 | B2 * | 8/2017 | Hamamoto | G03F 1/24 |
| 2004/0098924 | A1 | 5/2004 | Iwasa | |
| 2004/0127046 | A1 | 7/2004 | Takami | |
| 2004/0127047 | A1 | 7/2004 | Yamada et al. | |
| 2006/0084277 | A1 * | 4/2006 | Nakashima | C08G 77/08 438/758 |
| 2006/0242912 | A1 * | 11/2006 | Roh | C09G 1/02 51/308 |
| 2007/0066066 | A1 * | 3/2007 | Kojima | C09G 1/02 438/691 |
| 2007/0077764 | A1 | 4/2007 | Shimizu | |
| 2007/0186485 | A1 | 8/2007 | Iwasa | |
| 2007/0186486 | A1 | 8/2007 | Iwasa | |
| 2007/0256703 | A1 * | 11/2007 | Ikuta | B08B 7/0035 134/1 |
| 2008/0131571 | A1 * | 6/2008 | Nakayama | C09G 1/02 426/531 |
| 2008/0311487 | A1 * | 12/2008 | Ito | B24B 37/22 430/5 |
| 2009/0017335 | A1 * | 1/2009 | Takai | G11B 5/7315 428/846.2 |
| 2010/0003821 | A1 | 1/2010 | Morinaga et al. | |
| 2010/0209742 | A1 * | 8/2010 | Minazawa | C03C 19/00 428/846.9 |
| 2010/0213576 | A1 * | 8/2010 | Hiranaka | B82Y 20/00 257/615 |
| 2010/0224964 | A1 * | 9/2010 | Passek | C30B 29/06 257/618 |
| 2011/0207246 | A1 * | 8/2011 | Pitney | H01L 21/02024 438/14 |
| 2011/0240594 | A1 * | 10/2011 | Hamaguchi | G11B 5/8404 216/22 |
| 2011/0300778 | A1 * | 12/2011 | Ono | C09G 1/02 451/36 |
| 2012/0196033 | A1 * | 8/2012 | Sakai | G11B 5/8404 427/128 |
| 2013/0095660 | A1 | 4/2013 | Tanimoto et al. | |
| 2013/0220973 | A1 * | 8/2013 | Doi | C03C 19/00 216/53 |
| 2014/0285069 | A1 * | 9/2014 | Suenaga | H01L 41/0805 310/363 |
| 2015/0210891 | A1 | 7/2015 | Tsuchiya et al. | |
| 2015/0376464 | A1 * | 12/2015 | Tsuchiya | B24B 37/044 252/79.1 |
| 2017/0074807 | A1 * | 3/2017 | Nishimura | G01N 21/956 |

FOREIGN PATENT DOCUMENTS

| | | |
|---|---|---|
| CN | 1939663 | 4/2007 |
| CN | 102585705 | 7/2012 |
| CN | 103194148 | 7/2013 |
| JP | 2004-128070 | 4/2004 |
| JP | 2007-103515 | 4/2007 |
| JP | 2010-034509 | 2/2010 |
| WO | 2012/002525 | 1/2012 |
| WO | 2014/030570 | 2/2014 |

* cited by examiner

*Primary Examiner* — Allan W. Olsen
(74) *Attorney, Agent, or Firm* — Clark & Brody

(57) ABSTRACT

Proposed is a method for polishing a semiconductor substrate including an intermediate polishing step of polishing in such a way that the number of surface defects having heights of less than 3 nm is 45% or more of the total number of the surface defects on the surface of a semiconductor substrate, and a final polishing step of finish-polishing the semiconductor substrate after the intermediate polishing step.

4 Claims, 1 Drawing Sheet

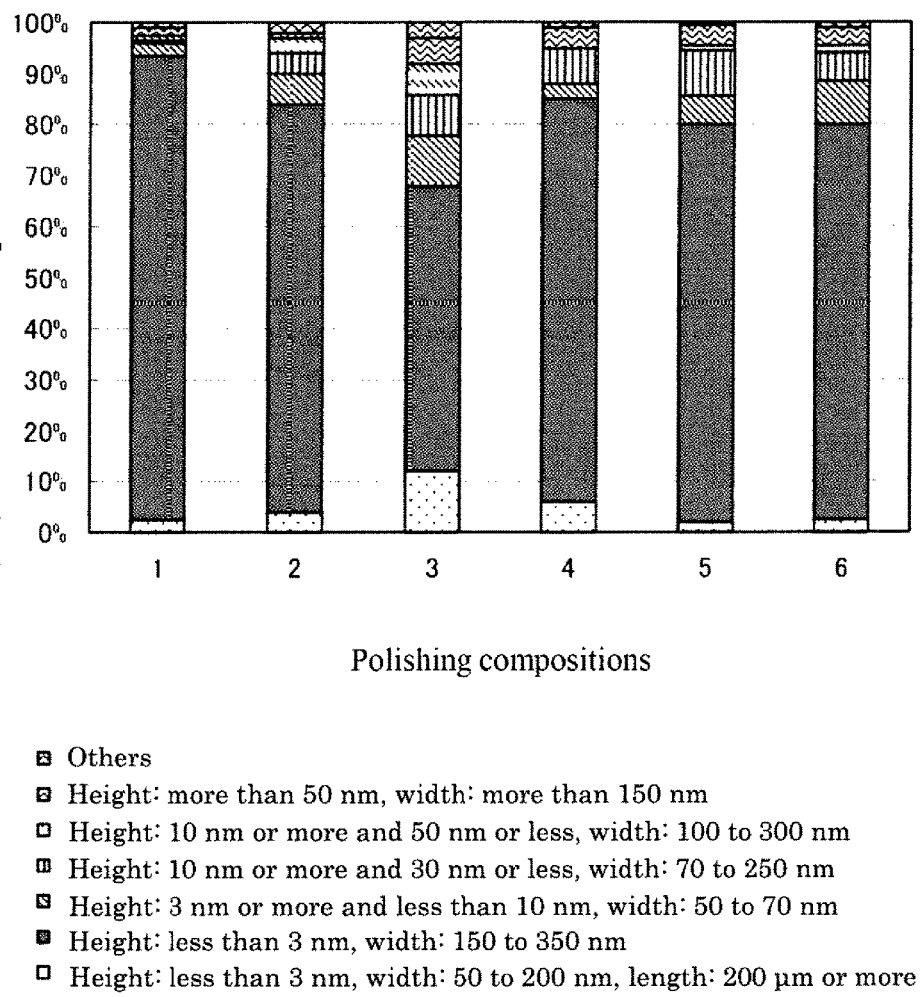
- Others
- Height: more than 50 nm, width: more than 150 nm
- Height: 10 nm or more and 50 nm or less, width: 100 to 300 nm
- Height: 10 nm or more and 30 nm or less, width: 70 to 250 nm
- Height: 3 nm or more and less than 10 nm, width: 50 to 70 nm
- Height: less than 3 nm, width: 150 to 350 nm
- Height: less than 3 nm, width: 50 to 200 nm, length: 200 μm or more

METHOD FOR POLISHING SEMICONDUCTOR SUBSTRATE

CROSS-REFERENCE TO RELATED APPLICATION

This application claims priority to Japanese Patent Application No. 2014-73797, the content of which is incorporated herein by reference.

BACKGROUND OF THE INVENTION

Field of the Invention

The present invention relates to a method for polishing a semiconductor substrate such as a semiconductor wafer.

Background Art

Recently, the miniaturization of semiconductor devices has progressed with the high integration or the like of integrated circuits, and consequently, in addition to high flatness, a high level reduction of surface defects has been required for semiconductor substrates (hereinafter, also simply referred to as substrates) such as semiconductor wafers (hereinafter, also simply referred to as wafers).

For the purpose of making such semiconductor substrates more flat and reducing such surface defects, polishing of the surface of substrates with a polishing composition including a water-soluble polymer, which is a component enhancing the wettability to semiconductor substrates, has been considered. Such a polishing composition used in the method for polishing is described in, for example, Patent Literature 1. Patent Literature 1 describes a polishing composition including hydroxyethyl cellulose as a water-soluble polymer.

The polishing of a semiconductor substrate usually adopts polishing methods performing polishing as multiple stages. In a multi-stage polishing method, the surface of a semiconductor substrate is polished flat in an early stage polishing such as the polishing in a first stage, a second stage and the like, and in the final polishing, a polishing designed for the purpose of achieving a more precise flatness is performed.

In general, surface defects having various sizes are present in a mixed manner on the surface of semiconductor substrates before polishing; however, in order to perform a polishing designed for the purpose of achieving a highly precise flatness as described above in the final polishing, a polishing composition mainly reducing the surface defects having minute sizes is used. Such a conventional polishing composition as described in Patent Literature 1 cannot selectively remove surface defects having specific sizes; consequently, when such a polishing composition is used in the polishing in the stages earlier than the final polishing, the surface defects having relatively large sizes and the surface defects having relatively small sizes on a substrate are equally polished. Accordingly, there is a possibility that surface defects having relatively larger sizes remain. Thus, there is a problem that even when a final polishing is performed in such a state, the surface defects after the final polishing cannot be sufficiently reduced.

CITATION LIST

Patent Literature

Patent Literature 1: Japanese Patent Laid-Open No. 2010-34509

SUMMARY OF THE INVENTION

Technical Problem

Accordingly, in view of such conventional problems as described above, the technical problem to be solved by the present invention is to provide a method for polishing a semiconductor substrate, capable of sufficiently reducing the surface defects of the semiconductor substrate after the final polishing.

Solution to Problem

The method for polishing a semiconductor substrate according to the present invention includes an intermediate polishing step of polishing in such a way that the number of surface defects having heights of less than 3 nm becomes 45% or more of the total number of the surface defects on the surface of a semiconductor substrate, and a final polishing step of finish-polishing the semiconductor substrate after the intermediate polishing step.

In the present invention, in the intermediate polishing step, polishing may be performed by using a polishing composition including hydroxyethyl cellulose, water and abrasive grains, wherein the hydroxyethyl cellulose has a molecular weight of 500,000 or more and 1,500,000 or less, and the mass ratio of the hydroxyethyl cellulose to the abrasive grains is 0.0075 or more and 0.025 or less.

In the present invention, in the intermediate polishing step, polishing may be performed by using a polishing composition including hydroxyethyl cellulose, water and abrasive grains, wherein the hydroxyethyl cellulose has a molecular weight of 500,000 or more and 1,500,000 or less, and the proportion of the hydroxyethyl cellulose adsorbed to the abrasive grains is 45% or more and 90% or less.

According to the present invention, before the intermediate polishing step, a double-sided polishing step of polishing both surfaces of the semiconductor substrate may be included.

In the present invention, in the final polishing step, polishing may be performed by using a polishing composition including hydroxyethyl cellulose, water and abrasive grains, wherein the hydroxyethyl cellulose has a molecular weight of 300,000 or more and 1,200,000 or less.

BRIEF DESCRIPTION OF THE DRAWING

FIG. 1 is a graph showing the proportions of surface defects after polishing.

DETAILED DESCRIPTION OF THE PREFERRED EMBODIMENT

Hereinafter, the method for polishing a semiconductor substrate according to the present invention is described.

The method for polishing a semiconductor substrate of the present embodiment includes an intermediate polishing step of performing polishing in such a way that the number of surface defects having heights of less than 3 nm becomes 45% or more of the total number of the surface defects on the surface of a semiconductor substrate, and a final polishing step of finish-polishing the semiconductor substrate after the intermediate polishing step.

(Semiconductor Substrate)

A semiconductor substrate polished by the polishing method of the present embodiment is a semiconductor substrate such as a silicon wafer for electronic devices, in which minute surface defects having widths or heights of a few nanometers are required to be removed.

(Double-sided Polishing Step)

The polishing method of the present embodiment may include a double-sided polishing step of polishing both surfaces of a semiconductor substrate, before the intermediate polishing step.

In the double-sided polishing step, both surfaces of a semiconductor substrate are polished by using a polishing composition including abrasive grains.

By performing such a double-sided polishing step, the surface defects having relatively larger sizes of the semiconductor substrate can be reduced.

(Intermediate Polishing Step)

In the polishing method of the present embodiment, the intermediate polishing step polishes a semiconductor substrate in such a way that the number of the surface defects having heights of less than 3 nm is 45% or more, preferably 70% or more and more preferably 90% or more of the total number of the surface defects on the surface of a semiconductor substrate. In other words, the polishing is performed so as to obtain a state in which the remaining proportion of the surface defects other than the relatively smaller surface defects is small.

On the surface of a semiconductor substrate, surface defects having various sizes are present in a mixed manner; examples of such surface defects include relatively larger surface defects having heights of 10 nm or more, minute surface defects having heights of less than 10 nm, minute surface defects having heights of less than 3 nm and widths of 50 to 200 nm, and minute surface defects having heights of less than 3 nm and widths of 150 to 350 m.

The height and the width of a surface defect as referred to in the present embodiment means the height and the width as measured with an atomic force microscope (AFM).

Additionally, the number of the surface defects as referred to in the present embodiment means the number of counts of the surface defects having each of the sizes as measured by using a surface defect inspection apparatus such as a confocal optical system laser microscope (MAGICS M5640, manufactured by Lasertec Corporation.).

In the polishing method of the present embodiment, the surface defects after the final polishing can be reduced efficiently and accurately in the following way: surface defects having relatively large sizes are made smaller in the intermediate polishing step or the double-sided polishing step before the final polishing step, and minute surface defects are removed in the final polishing step.

The determination of the presence or absence of the surface defects is performed by using the number of counts of the surface defects. Accordingly, when countable defects are present regardless of the sizes of the defects, the number of counts is large and it is determined that the defects are not reduced.

However, when the defects having large sizes remain in the final polishing step even in a small number of counts at the time of polishing in the final polishing step after performing the intermediate polishing step, the defects cannot be sufficiently reduced in the final polishing designed for the purpose of removing minute defects. Accordingly, it is important to remove, after performing the intermediate polishing step, the defects having sizes hardly removable by the polishing in the final polishing step, instead of reducing the number of counts of the surface defects.

In the intermediate polishing step of the present embodiment, polishing is performed in such a way that by selectively removing the surface defects having sizes of 3 nm or more in height, the number of the surface defects having heights of less than 3 nm after polishing becomes 45% or more of the total number of the surface defects. Accordingly, in the final polishing step performed after the intermediate polishing step, when the minute surface defects having heights of less than 3 nm remaining on the semiconductor substrate are removed, most of the surface defects present on the semiconductor substrate can be removed, and thus the surface defects after the final polishing step can be sufficiently reduced.

In the intermediate polishing step, in order to perform polishing so as for the number of the surface defects having heights of less than 3 nm to be 45% or more of the total number of the surface defects, for example, the following polishing composition may be used as the polishing composition.

(Polishing Composition)

Examples of the polishing composition used in the intermediate polishing step of the present embodiment includes a polishing composition including hydroxyethyl cellulose, water and abrasive grains, wherein the hydroxyethyl cellulose has a molecular weight of 500,000 or more and 1,500,000 or less, and the mass ratio of the hydroxyethyl cellulose to the abrasive grains is 0.0075 or more and 0.025 or less.

As the hydroxyethyl cellulose, hydroxyethyl cellulose having a molecular weight of 500,000 or more and 1,500,000 or less is used.

The molecular weight falling within the above-described range allows the polishing composition to exert removability particularly excellent for the surface defects having specific sizes in a polishing object.

Hydroxyethyl cellulose can improve the wettability; in particular, the hydroxyethyl cellulose having the molecular weight falling within the above-described range improves the wettability to a polishing object, and can reduce the particles and the like on the surface of the polishing object after polishing.

The molecular weight of hydroxyethyl cellulose in the present embodiment means the weight average molecular weight measured by using the GFC (Gel Filtration Chromatography) method, and specifically means the value measured by the measurement method shown in below-described Examples.

The polishing composition includes water. The hydroxyethyl cellulose is a hydrophilic polymer, hence easily yields an aqueous solution when mixed with water, and thus, as described above, can exert the functions such as improvement in the removability of the surface defects having specific sizes in a polishing object and the wettability.

The content of water is not particularly limited and water can be appropriately mixed.

When the polishing composition is used as diluted at the time of use, the polishing composition is prepared as a high-concentration liquid having a higher concentration than the concentration desired at the time of use, and water may be mixed as a diluting liquid at the time of dilution.

The polishing composition includes abrasive grains. Examples of the abrasive grains include: grains made of metal oxides such as silica, alumina, ceria and titania; silicon nitride grain; silicon carbide grain; and boron nitride grain.

Preferable among these is silica; particularly preferable among these is colloidal silica such as spherical or non-spherical colloidal silica. When the abrasive grains are colloidal silica, a hydroxyethyl cellulose aqueous solution is easily adsorbed to the abrasive grains, as described below, and thus preferably the removability of the surface defects having specific sizes can be more enhanced.

Of the colloidal silicas, non-spherical colloidal silica is preferable.

Non-spherical colloidal silica allows the hydroxyethyl cellulose aqueous solution to be more easily adsorbed thereto through the concomitant presence with hydroxyethyl cellulose in the polishing composition and allows the removability of the surface defects having specific sizes to be more enhanced, as described below, and thus it is preferable.

In the polishing composition, the mass ratio of the hydroxyethyl cellulose to the abrasive grains is 0.0075 or more and 0.025 or less.

The ratio of the content (% by mass) of the hydroxyethyl cellulose to the content (% by mass) of the abrasive grains in the polishing composition falling within the above-described range allows the removability of the surface defects having specific sizes to be more enhanced. At the same time, such a ratio as described above allows the wettability of the surface of a polishing object after polishing to be improved.

The content of the abrasive grains in the polishing composition of the present embodiment is not particularly limited, but is, for example, 5% by mass or more and 20% by mass or less.

The content of the abrasive grains falling within the above-described range is preferable, because such a content allows the polishing speed to be regulated appropriately.

The grain size of the abrasive grains is not particularly limited, but examples of the grain size include an average grain size of 85 nm or more. The average grain size of the abrasive grains falling within the above-described range is preferable because the surface defects having specific sizes present on the surface of a polishing object can be more sufficiently reduced.

The average grain size of the present embodiment is measured by using the DLS (dynamic light scattering) method. More specifically, the average grain size of the present embodiment means the average grain size in the polishing composition, as measured by using an apparatus described in below-described Examples. In other words, when the abrasive grains form clusters in the polishing composition as described below, the average grain size means the average grain size of the clusters.

The polishing composition includes the hydroxyethyl cellulose, water and the abrasive grains, and consequently the following interactions are considered to occur.

Specifically, in the polishing composition, part of the hydroxyethyl cellulose is adsorbed to the surface of the abrasive grains such as colloidal silica. Accordingly, in the polishing composition, there are the hydroxyethyl cellulose in a state of being adsorbed to the abrasive grains, and the hydroxyethyl cellulose not adsorbed to the abrasive grains and mixed in the polishing composition. It is considered that when the hydroxyethyl cellulose is adsorbed to the abrasive grains, the abrasive grains form clusters through the action of the hydroxyethyl cellulose. The larger the molecular weight of the hydroxyethyl cellulose, or the larger the content of the hydroxyethyl cellulose in the polishing composition, the larger the clusters tend to be.

It is considered that depending on such a size and such an amount of the clusters, the reduction performance of the surface defects having specific sizes present on the surface of a polishing object is varied.

The hydroxyethyl cellulose mixed in the polishing composition without being adsorbed to the abrasive grains can improve the wettability to a polishing object.

Accordingly, it is considered that by establishing a balance between the hydroxyethyl cellulose adsorbed to the abrasive grains and the hydroxyethyl cellulose not adsorbed to the abrasive grains, the polishing composition of the present embodiment can reduce the surface defects having specific sizes, present on the surface of a polishing object.

The polishing composition used in the intermediate polishing step of the present embodiment is a polishing composition including hydroxyethyl cellulose, water and abrasive grains, wherein the hydroxyethyl cellulose has a molecular weight of 500,000 or more and 1,500,000 or less, and the proportion of the hydroxyethyl cellulose adsorbed to the abrasive grains is preferably 45% or more and 90% or less.

The hydroxyethyl cellulose having a molecular weight of 500,000 or more and 1,500,000 or less, and the proportion of the hydroxyethyl cellulose adsorbed to the abrasive grains being 45% or more and 90% or less allow, as described above, the sizes and the amount of the clusters to be regulated so as to fall within appropriate ranges, and the surface defects having specific sizes present on the surface of a polishing object to be sufficiently reduced.

In the present embodiment, the proportion of the hydroxyethyl cellulose adsorbed to the abrasive grains is the percentage calculated by the following method.

The TOC (Total Organic Carbon) amount of the supernatant liquid obtained by centrifuging 1.5 mg of the polishing composition at 14,000 rpm for 10 min, and the TOC amount of the polishing composition are measured, and the proportion of the hydroxyethyl cellulose adsorbed to the abrasive grains (the proportion of the adsorbed hydroxyethyl cellulose (%)) is calculated by the following formula 1.

Proportion of adsorbed hydroxyethyl cellulose (%)= (TOC of polishing composition−TOC of supernatant liquid)/(TOC of polishing composition)    (Formula 1)

In the present embodiment, the grain size of the abrasive grains (clusters) and the proportion of the hydroxyethyl cellulose adsorbed to the abrasive grains mean the grain size and the proportion at the time of use of the polishing composition, respectively.

The polishing composition may further include ammonia.

The inclusion of ammonia allows the surface defects having specific sizes present on the surface of a polishing object to be reduced more sufficiently, and thus it is preferable.

The content of ammonia is not particularly limited, but, examples of the content of ammonia include 0.1% by mass or more and 1.0% by mass or less, and preferably 0.25% by mass or more and 0.75% by mass or less.

The content of ammonia falling within the above-described range allows the surface defects having specific sizes present on the surface of a polishing object to be more sufficiently reduced, and thus it is preferable.

The content of ammonia falling within the above-described range also allows the pH of the polishing composition to be regulated so as to fall within an appropriate range, and thus it is preferable.

The polishing composition may further include other components. Examples of the other components include: a pH adjuster, a surfactant and a chelating agent.

The polishing composition may be prepared as a high concentration liquid having a higher concentration than the desired concentration at the time of use, and may be diluted at the time of use.

When the polishing composition is prepared as such a high concentration liquid, the high concentration liquid is convenient for storage and transportation.

When the polishing composition is prepared as a high concentration liquid, examples of the preparation include preparation in which the high concentration liquid is prepared so as to have a concentration capable of being diluted at the time of use by a factor of approximately, for example, 5 to 100-fold, preferably 20 to 60-fold and more preferably 21 to 41-fold.

(Final Polishing Step)

The polishing method of the present embodiment includes a final polishing step of finish-polishing the semiconductor substrate after the intermediate polishing step.

In the final polishing step, while relatively smaller minute defects having heights of less than 3 nm remaining on the surface of the semiconductor substrate after performing the intermediate polishing step are being removed, the semiconductor substrate is polished into a substrate having high flatness free from haze or the like.

The polishing composition used in the final polishing step is not particularly limited, but examples of the final polishing step include polishing using a polishing composition including hydroxyethyl cellulose, water and abrasive grains wherein the hydroxyethyl cellulose has a molecular weight of 300,000 or more and 1,200,000 or less.

When such a polishing composition is used in the polishing of the final polishing step, the surface defects after the polishing can be reduced more sufficiently.

The method for polishing a semiconductor substrate according to the present embodiment is as described above, but it should be construed that the embodiment disclosed is presented in all aspects as exemplification for describing the present invention, and the present invention is not limited to the embodiment. The scope of the present invention is defined not by the foregoing description but by the appended claims, and is intended to include all the modifications in the meaning of equivalence to the claims and within the scope of the present invention.

According to the present invention, the polishing method includes an intermediate polishing step of polishing in such a way that the number of the surface defects having heights of less than 3 nm becomes 45% or more of the total number of the surface defects on the surface of a semiconductor substrate, and a final polishing step of finish-polishing the semiconductor substrate after the intermediate polishing step; accordingly, the surface defects on the surface of the semiconductor substrate after the final polishing step can be sufficiently reduced.

In the present invention, polishing may also be performed, in the intermediate polishing step, by using a polishing composition including hydroxyethyl cellulose, water and abrasive grains, wherein the hydroxyethyl cellulose has a molecular weight of 500,000 or more and 1,500,000 or less, and the mass ratio of the hydroxyethyl cellulose to the abrasive grains is 0.0075 or more and 0.025 or less.

In the present invention, polishing may also be performed, in the intermediate polishing step, by using a polishing composition including hydroxyethyl cellulose, water and abrasive grains, wherein the hydroxyethyl cellulose has a molecular weight of 500,000 or more and 1,500,000 or less, and the proportion of the hydroxyethyl cellulose adsorbed to the abrasive grains is 45% or more and 90% or less.

By polishing with such a polishing composition as described above in the intermediate polishing step, the surface defects on the surface of the semiconductor substrate after the final polishing step can be reduced more sufficiently.

When polishing is performed by using, in the final polishing step, a polishing composition including hydroxyethyl cellulose, water and abrasive grains, wherein the hydroxyethyl cellulose has a molecular weight of 300,000 or more and 1,200,000 or less, the surface defects on the surface of the semiconductor substrate after the final polishing step can be reduced more sufficiently.

As described above, according to the present invention, the surface defects of the semiconductor substrate after the final polishing can be reduced sufficiently.

EXAMPLES

Hereinafter, Examples of the present invention are described; however, the present invention is not limited to these Examples.

In present Example, a polishing test was performed by using the polishing composition used in the intermediate polishing step.

(Hydroxyethyl Cellulose)

Hydroxyethyl celluloses having different molecular weights (500,000 and 1,000,000) shown in following Table 1 were prepared.

The molecular weights of the hydroxyethyl celluloses are the molecular weights as measured by the following method.

(Measurement of Molecular Weight)

The molecular weight is the weight average molecular weight obtained by the following measurement.

The measurement was performed by using a GFC apparatus (Model PU-2085 plus system, manufactured by JASCO Corporation) as the measurement apparatus, two serially connected columns Asahipak GF-710HQ and Asahipak GF-310 HQ manufactured by Shodex Co., Ltd., and a 0.7% aqueous solution of sodium chloride as an eluent.

The hydroxyethyl cellulose (HEC), the abrasive grains (silicon dioxide produced by sol-gel method, grain size in water: 66 nm by dynamic light scattering), ammonia and the balance water were mixed according to the compositions shown in Table 1, to yield the polishing compositions 1 to 6.

The polishing compositions were each diluted by a factor of 41-fold with water, silicon wafers (12 inch) as objects to be polished were polished with the diluted polishing compositions under the following polishing conditions, the surface defects after polishing were measured by the following method, and the results thus obtained are shown in Table 1.

(Polishing Conditions)

Polishing apparatus: SPP800S (manufactured by Okamoto Machine Tool Works, Ltd.)

Polishing pad: POLYPAS 24T (manufactured by Fujibo Ehime Co., Ltd.)

Platen speed: 40 rpm

Polishing load: 120 gf/cm$^2$

Flow rate: 0.6 L/min

Object to be polished: 12-inch Silicon wafer

Polishing time: 300 sec (Measurement Method of Surface Defects)

The wafers after polishing under the above-described polishing conditions were washed with an ammonia/hydrogen peroxide mixed liquid, and then the measurement (edge exclusion EE: 5 mm, Slice level: D37 mV) of the surface defects was performed by using a measurement apparatus (MAGICS M5640, manufactured by Lasertec Corporation.).

On the basis of the coordinates of the defects measured by MAGICS, the measurement of the defects was performed by using the measurement apparatus AFM SAP465 (manufactured by Seiko Instruments Inc.).

From these two types of measurements, the surface defects were classified into Types A to F by the following method, and the proportions of the respective surface defects are shown in the graph of FIG. 1. In Table 1, the proportions of the respective types are shown by percentage.

(Classification of MAGICS Review Images)

In the classification method of the MAGICS review images, according to the order of the white and black portions varying from the left toward the right of the image in the defective portions of each of the review images, the MAGIC review images were classified into the following Types A to F. For the analysis of the MAGICS review images, a band pass filter was used.

On a MAGICS review image, due to the effect of the band pass filter, when the defects are extremely small (low), the color varies three times as a sequence of white→black-→white or as a sequence of black→white→black. Which of the sequence of white→black→white and the sequence of black→white→black corresponds to the low height defects is analyzed with AFM.

Type A: White-black-white, and scratch-like image
Type B: White-black-white
Type C: Black-white-black
Type D: White-black
Type E: Black-white
Type F: Black (Dimension of Surface Defects)

The respective types of the defects were measured with AFM, and the dimensions of the respective types of defects were found to fall within the following ranges.

Specifically, the defects were classified into the following Types A to F.

Type A: Height: less than 3 nm, width: 50 to 200 nm, length: 200 μm or more
Type B: Height: less than 3 nm, width: 150 to 350 nm
Type C: Height: 3 nm or more and less than 10 nm, width: 50 to 70 nm
Type D: Height: 10 nm or more and 30 nm or less, width: 70 to 250 nm
Type E: Height: 10 nm or more and 50 nm or less, width: 100 to 300 nm
Type F: Height: more than 50 nm, width: more than 150 nm Type A is a scratch-like defect having a length component, and Types B to F are dot-like or irregular defects.

(pH)

The pH of each of the polishing compositions and the pH of each of the 41-fold diluted liquids of these polishing compositions at a liquid temperature of 25° C. were measured with a pH meter (manufactured by HORIBA, Ltd.).

(Measurement of Adsorbed Hydroxyethyl Cellulose)

Each of the polishing compositions was diluted by a factor of 41-fold with water, a 1.5 mg sample was obtained from the diluted polishing composition, and the sample was centrifuged by using the centrifuge MCD-2000 (manufactured by AS ONE Corporation) at 14,000 rpm for 10 min. Subsequently, each of the centrifuged samples was separated into the precipitate and the supernatant liquid, the supernatant liquid was taken out, and the TOC (Total Organic Carbon) amount of each of the supernatant liquids and the TOC amount of each of the polishing compositions were measured with the measurement apparatus Sievers 900 (manufactured by GE). From the measurement results, the proportion of the adsorbed hydroxyethyl cellulose in each of the polishing compositions was calculated by the following formula 1, and the results thus obtained are shown in Table 1.

Proportion of adsorbed hydroxyethyl cellulose (%)= (TOC of polishing composition−TOC of supernatant liquid)/(TOC of polishing composition)× 100 (Formula 1)

(Measurement of Grain Size of Clusters)

The grain size of the abrasive grains (clusters) in the 41-fold diluted liquid of each of the polishing compositions was measured.

The grain sizes were measured by using, as the measurement apparatus, the zeta potential/grain size measurement system ELSZ-2 (manufactured by OTSUKA ELECTRONICS Co., LTD.). The results thus obtained are shown in Table 1.

TABLE 1

| | Silica concentration | Abrasive grain concentration (%) | $NH_3$ concentration | $NH_3$ concentration (%) | HEC concentration | HEC concentration (%) | HEC concentration/ silica concentration | Molecular weight of HEC |
|---|---|---|---|---|---|---|---|---|
| Polishing composition 1 | 95000 | 9.5 | 5000 | 0.5 | 1500 | 0.15 | 0.0158 | 1000000 |
| Polishing composition 2 | 95000 | 9.5 | 5000 | 0.5 | 750 | 0.075 | 0.0079 | 1000000 |
| Polishing composition 3 | 95000 | 9.5 | 5000 | 0.5 | 3000 | 0.3 | 0.0316 | 1000000 |
| Polishing composition 4 | 95000 | 9.5 | 2500 | 0.25 | 1500 | 0.15 | 0.0158 | 1000000 |
| Polishing composition 5 | 95000 | 9.5 | 7500 | 0.75 | 1500 | 0.15 | 0.0158 | 1000000 |
| Polishing composition 6 | 95000 | 9.5 | 5000 | 0.5 | 750 | 0.075 | 0.0079 | 500000 |

| | Grain size (nm) | pH of undiluted liquid | ×41 pH | Proportion of Type A (%) | Proportion of Type B (%) | Proportion of Type C (%) | Proportion of Type D (%) | Proportion of Type E (%) | Proportion of Type F (%) | Others | Adsorbed HEC (%) |
|---|---|---|---|---|---|---|---|---|---|---|---|
| Polishing composition 1 | 86.4 | 10.6 | 9.8 | 2.5% | 91.0% | 2.5% | 0.5% | 1.0% | 1.5% | 1.0% | 74% |

TABLE 1-continued

| | | | | | | | | | | |
|---|---|---|---|---|---|---|---|---|---|---|
| Polishing composition 2 | 82.0 | 10.7 | 9.8 | 4.0% | 80.0% | 6.0% | 4.0% | 3.0% | 1.0% | 2.0% | 72% |
| Polishing composition 3 | 102.1 | 10.5 | 9.8 | 12.0% | 56.0% | 10.0% | 8.0% | 6.0% | 5.0% | 3.0% | 64% |
| Polishing composition 4 | 142.7 | 10.3 | 9.6 | 6.0% | 79.0% | 3.0% | 7.0% | 0.0% | 4.0% | 1.0% | 82% |
| Polishing composition 5 | 84.7 | 10.8 | 9.9 | 2.0% | 78.1% | 5.5% | 9.0% | 1.0% | 4.0% | 0.5% | 72% |
| Polishing composition 6 | 75.8 | 10.8 | 9.8 | 2.5% | 77.6% | 8.5% | 5.5% | 1.5% | 3.5% | 1.0% | 39% |

As can be seen from Table 1, the proportions of Type B surface defects remaining on the surfaces of the wafers after polishing can be made to be 45% or more depending on the ratio of the content of the hydroxyethyl cellulose to the content of the abrasive grains and the proportion of the adsorbed hydroxyethyl cellulose in the polishing composition. In other words, as is obvious, when polishing is performed in the intermediate polishing step by using a polishing composition capable of sufficiently removing the surface defects other than Type B surface defects, a large number of surface defects having easily removable sizes can be made present on the substrate in the subsequent final polishing step, and thus, the surface defects can be sufficiently reduced after the final polishing step.

The invention claimed is:

1. A method for polishing a semiconductor substrate, comprising:
   an intermediate polishing step if polishing in such a way that the number of surface defects having heights of less than 3 nm becomes 45% or more of the total number of the surface defects on the surface of a semiconductor substrate; and
   a final polishing step of finish-polishing the semiconductor substrate after the intermediate polishing step,
   wherein in the intermediate polishing step, polishing is performed by using a polishing composition comprising: hydroxyethyl cellulose, water and abrasive grains, the hydroxyethyl cellulose has a molecular weight of 500,000 or more and 1,500,000 or less, and the mass ratio of the hydroxyethyl cellulose to the abrasive grains is 0.0075 or more and 0.025 or less, and
   wherein in the final polishing step, polishing is performed by using a polishing composition comprising: hydroxyethyl cellulose, water and abrasive grains, and the hydroxyethyl cellulose has a molecular weight of 300,000 or more and 1,200,000 or less, and has a different molecular weight from that of the hydroxyethyl cellulose present in the polishing composition used in the intermediate polishing step.

2. A method for polishing a semiconductor substrate, comprising:
   an intermediate polishing step of polishing in such a way that the number of surface defects having heights of less than 3 nm becomes 45% or more of the total number of the surface defects on the surface of a semiconductor substrate; and
   a final polishing step of finish-polishing the semiconductor substrate after the intermediate polishing step,
   wherein in the intermediate polishing step, polishing is performed by using a polishing composition comprising: hydroxyethyl cellulose, water and abrasive grains, the hydroxyethyl cellulose has a molecular weight of 500,000 or more and 1,500,000 or less, and the proportion of the hydroxyethyl cellulose absorbed to the abrasive grains is 45% or more and 90% or less, and
   wherein in the final polishing step, polishing is performed by using a polishing composition comprising: hydroxyethyl cellulose, water and abrasive grains, and the hydroxyethyl cellulose has a molecular weight of 300,000 or more and 1,200,000 or less and has a different molecular weight from that of the hydroxyethyl cellulose present in the polishing composition used in the intermediate polishing step.

3. The method for polishing a semiconductor substrate according to claim 1, comprising, before the intermediate polishing step, a double-sided polishing step of polishing both surfaces of the semiconductor substrate.

4. The method for polishing a semiconductor substrate according to claim 2, comprising, before the intermediate polishing step, a double-sided polishing step of polishing both surfaces of the semiconductor substrate.

* * * * *